United States Patent
Sedlmaier

(10) Patent No.: US 7,781,945 B2
(45) Date of Patent: Aug. 24, 2010

(54) CERAMIC MULTILAYER COMPONENT, METHOD FOR THE PRODUCTION THEREOF, AND RETAINING DEVICE

(75) Inventor: Peter Sedlmaier, Ruden (AT)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 12/371,132

(22) Filed: Feb. 13, 2009

(65) Prior Publication Data
US 2009/0142722 A1   Jun. 4, 2009

Related U.S. Application Data

(62) Division of application No. 10/504,398, filed on May 30, 2006, now Pat. No. 7,508,112.

(51) Int. Cl.
*H01L 41/08* (2006.01)

(52) U.S. Cl. .................. 310/341; 310/343; 219/390

(58) Field of Classification Search .......... 310/311, 310/341–343
See application file for complete search history.

(56) References Cited

U.S. PATENT DOCUMENTS

| 4,900,247 | A | 2/1990 | Takahashi |
|---|---|---|---|
| 5,364,608 | A | 11/1994 | Edler |
| 5,628,849 | A | 5/1997 | Fasano |
| 6,573,639 | B1 | 6/2003 | Heinze et al. |
| 7,508,112 | B2 | 3/2009 | Sedlmaier |
| 2002/0098333 | A1 | 7/2002 | Feltz et al. |
| 2003/0027432 | A1 | 2/2003 | Sumiya et al. |
| 2006/0234020 | A1 | 10/2006 | Sedlmaier |
| 2009/0141460 | A1 | 6/2009 | Sedlmaier |

FOREIGN PATENT DOCUMENTS

| DE | 25 42 083 | 3/1976 |
|---|---|---|
| DE | 100 62 672 | 8/2001 |
| DE | 102 35 253 | 4/2003 |
| EP | 0 444 422 | 1/1991 |
| EP | 0 452 718 | 10/1991 |
| JP | 11-304371 | 2/2000 |
| JP | 2002-029857 | 5/2002 |
| RU | 2 144 170 | 1/2000 |
| WO | WO94/29092 | 12/1994 |
| WO | WO01/45138 | 6/2001 |
| WO | WO03/069689 | 8/2003 |

OTHER PUBLICATIONS

Action and Response History in U.S. Appl. No. 10/504,398, as retrieved from PAIR on Dec. 29, 2009.
Hirakata et al., "Multilayer Capacitors with Copper Inner Electrodes"; Ferroelectrics, vol. 133(1-4), pp. 139-144; XP-001010835 (1992).
Office Action in U.S. Appl. No. 12/371,115, dated Nov. 20, 2009.
Final Office Action in U.S. Appl. No. 12/371,115, dated Apr. 6, 2010.
International search report for PCT application No. PCT/DE2003/00435 dated Jan. 26, 2004 (English and German versions).

*Primary Examiner*—Mark Budd
(74) *Attorney, Agent, or Firm*—Fish & Richardson P.C.

(57) ABSTRACT

A retaining device for use when sintering electrical components made of ceramic and metal electrodes inside the ceramic. The retaining device includes a structure to hold the electrical components. The structure has a surface that contains a sintering aid. The sintering aid includes a material that is able to bind to a gas contained in the structure and to release the gas.

10 Claims, 3 Drawing Sheets

CERAMIC MULTILAYER COMPONENT, METHOD FOR THE PRODUCTION THEREOF, AND RETAINING DEVICE

CROSS-REFERENCE TO RELATED APPLICATIONS

This application is a divisional of U.S. application Ser. No. 10/504,398, filed May 30, 2006, now U.S. Pat. No. 7,508,112 the contents of which are incorporated by reference into this application as if set forth herein in full. This application also claims priority to international application no. PCT/DE03/00435, and to German application no. 10205877.6. The contents of international application no. PCT/DE03/00435 and German application no. 10205877.6 are incorporated by reference into this application as if set forth herein in full.

TECHNICAL FIELD

The invention relates to a ceramic multi-layer component, having a base body containing a sintered ceramic and having internal electrodes. Furthermore, the invention relates to a method for producing a ceramic multi-layer component, in which an unsintered ceramic is sintered. Furthermore, the invention relates to a retaining device for use when sintering a ceramic multi-layer component.

BACKGROUND

From published patent WO 01/45138 A2, a method is known for producing a piezoelectric component that has internal electrodes made of copper. The component is produced by sintering in a sintering atmosphere that contains oxygen. The requisite oxygen partial pressure is set via a gas equilibrium that appears between the gases hydrogen and water vapor. Normally, ceramic materials based on lead zirconium titanate are used to produce a piezo actuator. In addition, retaining devices are used for holding a large number of unsintered components in a sintering furnace, which are made up of temperature-resistant structured ceramics, such as alumina, cordierite, silicon carbide, etc.

To prevent oxidation of the copper internal electrodes, it is necessary in the known method to set the oxygen partial pressure within a very narrow permissible pressure range. If the oxygen partial pressure is below this permissible level, the PZT ceramic is very easily reduced and thereby irreversibly damaged. If the permissible oxygen partial pressure is exceeded, this results in oxidation of and damage to the copper internal electrodes.

The known method has the disadvantage that the oxygen partial pressure set by the hydrogen/water vapor gas equilibrium can very easily be pushed outside of the permissible working range by very small quantities of oxygen-absorbing or oxygen-releasing substances. For example, substances such as residual carbon, impurities in the ceramic, or evaporation of lead from the ceramic can result in a shift in the oxygen partial pressure.

This can have the effect that even with the best possible setting of the gas atmosphere during sintering, local oxidation of the copper internal electrodes is observable. This manifests itself in intermediate layers or intermediate areas of copper oxide deposited between the internal electrodes and the ceramic material, which is macroscopically visible in the micrograph perpendicular to the internal electrodes. These intermediate layers of copper oxide cause degrading of the electrical properties of the piezoelectric component.

SUMMARY

It is the object of the present invention to provide a method for producing a ceramic multi-layer component, in which the oxygen content of the sintering atmosphere is stabilized. It is also the object of the invention to provide a ceramic multi-layer component whose electrical properties are improved. In addition, it is the object of the invention to provide a retaining device which permits the method according to the invention for producing a ceramic multi-layer component to be carried out in simple manner.

These problems are solved by a method for producing a ceramic multi-layer component according to claims 1 and 2, by a ceramic multi-layer component according to claim 8. Advantageous embodiments of the invention are the subject of the dependent claims.

A method for producing a ceramic multi-layer component is provided, wherein a base body that contains an unsintered ceramic and that has at least one metal-containing internal electrode is sintered. The sintering takes place in a sintering atmosphere, normally in a closed sintering volume. Within the sintering atmosphere, there is a sintering aid, which is able to bind and again release a gas contained in the sintering atmosphere.

This binding can occur, for example, by means of physisorption or else by chemisorption.

The provision of a sintering aid in the sintering atmosphere has the advantage that the sintering aid can work to a certain extent as a buffer, which is able to bind a surplus gas component contained in the sintering atmosphere and to give off the same component to the sintering atmosphere if it is deficient. That makes it possible to stabilize the sintering atmosphere in regard to its gas composition.

Furthermore, a method for producing a ceramic multi-layer component is specified in which the sintering aid contains a metal whose redox potential is at least as great as the redox potential of the metal contained in the internal electrodes.

By providing a metal-containing a sintering aid in the sintering atmosphere during the sintering, it is possible to achieve the result that if the sintering atmosphere is modified in such a way that the internal electrodes are oxidized, the sintering aid is oxidized first by preference. That makes it possible to prevent oxidation of the internal electrodes. Metals whose redox potential is lower than the redox potential of the metal contained in the internal electrodes are less well suited for this purpose, since they are easily oxidized in sintering atmospheres that just avoid oxidation of the more noble internal electrodes and would thereby, for example, constantly extract oxygen from the sintering atmosphere.

In contrast, metals are suitable as sintering aids whose redox potential is greater than the redox potential of the metal contained in the internal electrodes, and which are thus more noble than the metal of the internal electrodes. Since the sintering aid is freely accessible for the sintering atmosphere, and since in contrast the internal electrodes are not freely accessible for the sintering atmosphere because of being located in the interior of the base body, in the case of a sintering atmosphere that deviates from ideal conditions, in spite of the greater redox potential the sintering aid is modified by the atmosphere even before the internal electrodes. At the same time, the internal electrodes are preserved unchanged, which is desired.

In addition, a ceramic multi-layer component is provided that has a base body with a sintered ceramic. The base body contains at least one internal electrode, at least the surface of which contains metal. The internal electrode contains a metal whose redox potential is lower than or equal to the redox potential of copper. The internal electrodes, or their metallic surfaces, border directly on the sintered ceramic of the base body. A layer or surface areas with oxidized metal of the internal electrode are not present. Such a multi-layer component can be produced using the specified method. It has the advantage that because of the absence of metal oxide between the internal electrodes and the sintered ceramic, the electrical properties of the multi-layer component are improved.

In addition, a retaining device is specified that is designed for use when sintering ceramic multi-layer components having metal-containing internal electrodes. The retaining device is suitable for accommodating a large number of unsintered components. On the surface of the retaining device there is a material that is able to bind and release again a gas contained in the sintering atmosphere.

Such a retaining device has the advantage that it enables easy implementation of the specified method for producing a ceramic multi-layer component. In addition, the retaining device has the advantage that a large number of components can be produced with the same advantageous conditions of the sintering atmosphere. The retaining device, or the surface of the retaining device, guarantees that the material which is beneficial for the sintering process, i.e., the sintering aid, is uniformly present in the sintering atmosphere and is always in the vicinity of an unsintered component.

In addition, a retaining device is specified whose surface contains a metal whose redox potential is at least as great as the redox potential of the metal contained in the internal electrodes of the component to be sintered.

In an advantageous embodiment, the method for producing a ceramic multi-layer component can be designed in such a way that bodies are used whose internal electrodes contain copper. Copper is also used as the sintering aid. The use of copper as the material for the internal electrodes has the advantage that copper is simply and cheaply obtained. The use of copper as a sintering aid has the advantage that copper is simply and cheaply obtained, and that it can also be readily worked, so that using a retaining device of copper when conducting the method is advantageous.

Furthermore, a method for producing a ceramic multi-layer component in which the sintering atmosphere contains oxygen is advantageous. Oxygen is a gas which is utilized in many sintering processes. It is needed in order to lend the unsintered ceramic the beneficial properties of the sintered ceramic.

In addition, the oxygen contained in the sintering atmosphere can easily be bound and released again by a sintering aid of copper.

Also advantageous is a method for producing a ceramic multi-layer component in which the sintering atmosphere contains, in addition to oxygen, a mixture of hydrogen and water vapor. The equilibrium between hydrogen and water vapor makes it possible on the one hand to effectively reduce the danger of oxidation of the internal electrodes. On the other hand, it allows the oxygen partial pressure in the sintering atmosphere to be stabilized. The use of copper as a sintering aid also acts beneficially in this respect, since the reaction $$4Cu + 2H_2O \leftrightharpoons 2Cu_2O + 2H_2 \leftrightharpoons 4Cu + O_2 + 2H_2$$

catalyzes the equilibrium reaction $$2H_2O \leftrightharpoons O_2 + 2H_2$$

and hence the state of equilibrium is reached significantly more rapidly.

A possibility as the ceramic material for the component is, for example, a ceramic with a piezoelectric effect. That makes it possible for piezoelectric actuators to be produced advantageously. For example, a possibility is to use lead zirconate titanate as the ceramic material.

In addition, it is advantageous to use copper of a minimum impurity, as exhibited for example by electrolytic copper, for the sintering aid. A possibility for example is oxygen-free copper with a purity of >99.9%.

In an advantageous embodiment, the retaining device consists of two parts, which are separated from each other by a gap. The gap makes it possible both for gases that arise during the sintering to escape and for the evaporation of lead from the ceramic material to be controlled.

It is advantageous for the gap between the two parts of a container to be between 0.5 and 10 mm in width. By adhering to these limits, it is possible for enough gas to still escape from the components to be sintered, while also preventing too much lead from evaporating off.

Another possibility is to provide a latticed insert in the container for the retaining device.

In particular, when using copper or other easily worked materials, it can be advantageous to design the retaining device in the form of a sector of a circular ring, which enables the volume in rotating hearth sintering furnaces to be utilized optimally. These sector-shaped retaining devices can be completed to make a circular ring, and can optimally fill the available volume in a rotating hearth sintering furnace with components held by the retaining device and to be sintered.

The invention will now be explained in greater detail on the basis of exemplary embodiments and the matching figures.

DETAILED DESCRIPTION

Figure 1:
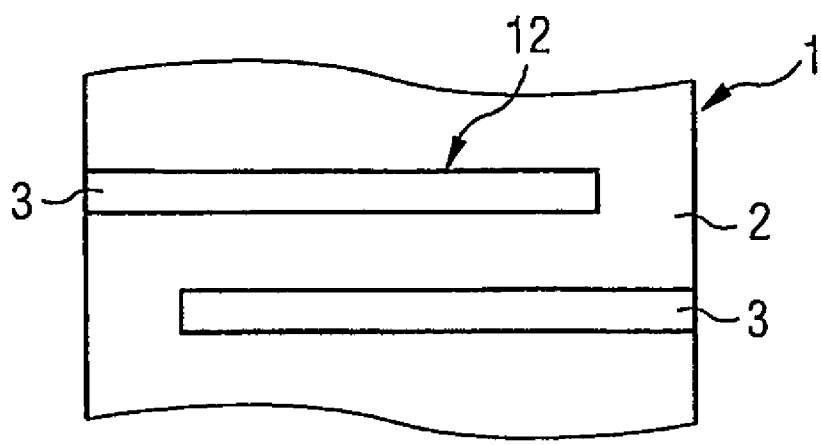
FIG. 1 shows an example of a ceramic multi-layer component in a schematic cross section.

FIG. 1 shows a ceramic multi-layer component produced with the exemplary method, having a base body 1 that contains a sintered ceramic 2. In the interior of the base body 1 are internal electrodes 3, which have a metal-containing surface 12, and which in an advantageous embodiment contain copper or even are made entirely of copper. The surface 12 borders directly on the ceramic 2.

Figure 5:
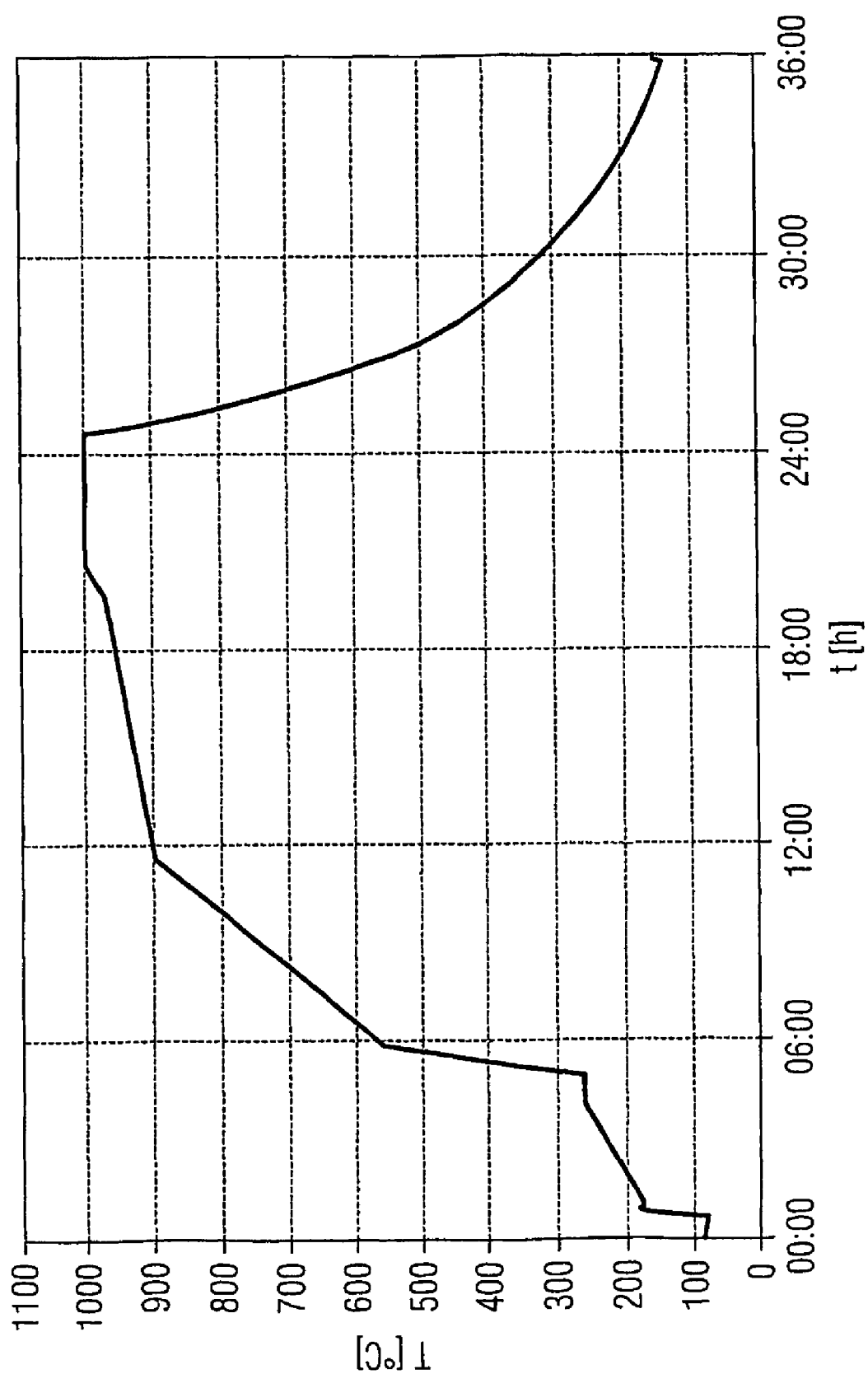
FIG. 5 shows an example of a time profile of the sintering temperature during the production of a component according to the invention.

The component shown in FIG. 1 can be, for example, a piezo actuator, with a perovskite ceramic of the PZT type $Pb(Zr_xTi_{1-x})O_3$ and with internal electrodes of copper. A piezo actuator of this sort can be produced by sintering a stack of stratified green sheets, with the temperature profile during the sintering corresponding to the temperature profile indicated in FIG. 5. In FIG. 5, the sintering temperature T is indicated as a function of the sintering time t. The sintering temperature T has a maximum of 1005° C. At this temperature the oxygen partial pressure in the sintering chamber is $2.2 \times 10^7$ bar. The upper boundary oxygen partial pressure is given by the oxidation of copper, and is $6.3 \times 10^7$ bar at this temperature. The lower boundary oxygen partial pressure is given by the reduction of PbO in the ceramic, and is $1.7 \times 10^8$ bar at this temperature. The oxygen partial pressure is thus in a range in which PbO is no longer reduced from the ceramic, which stabilizes the ceramic, and in which copper is furthermore not yet oxidized, which stabilizes the internal electrodes.

Figure 2:
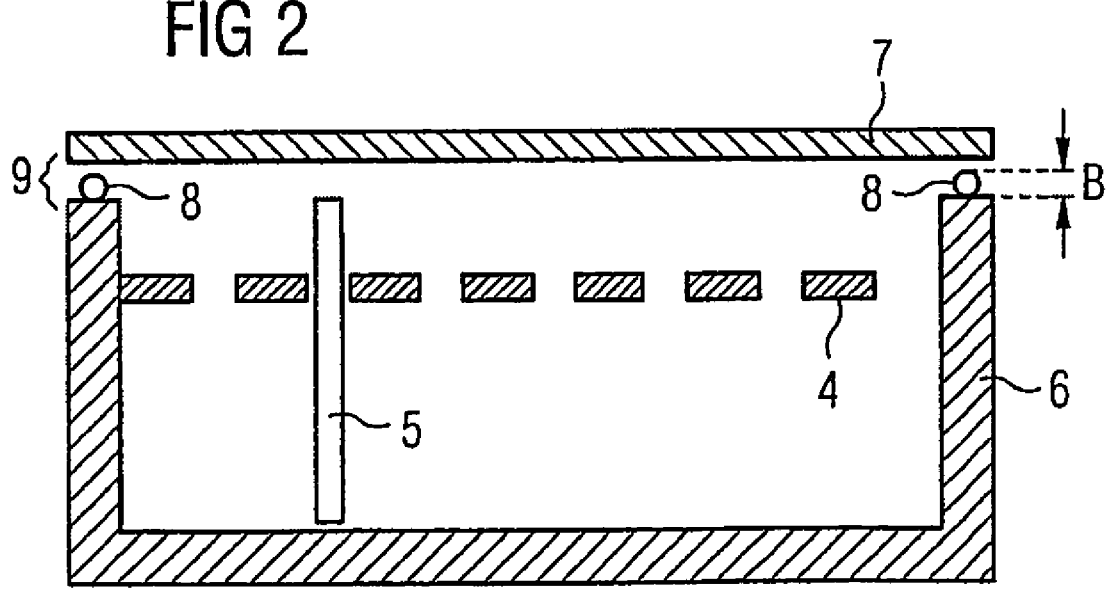
FIG. 2 shows an example of a retaining device in a schematic cross section.

FIG. 2 shows a retaining device for use in the method for producing a ceramic multi-layer component, where the retaining device includes a container 6 in which a latticed insert 4 is provided to accommodate unsintered components 5. Container 6 can be closed with a cover 7. Between container 6 and cover 7 there are means 8 for providing a gap 9 between container 6 and cover 7. These means 8 can be for example spacing elements made of a ceramic. Advantageously, the width B of the gap 9 is between 0.5 and 10 mm.

Figure 3:
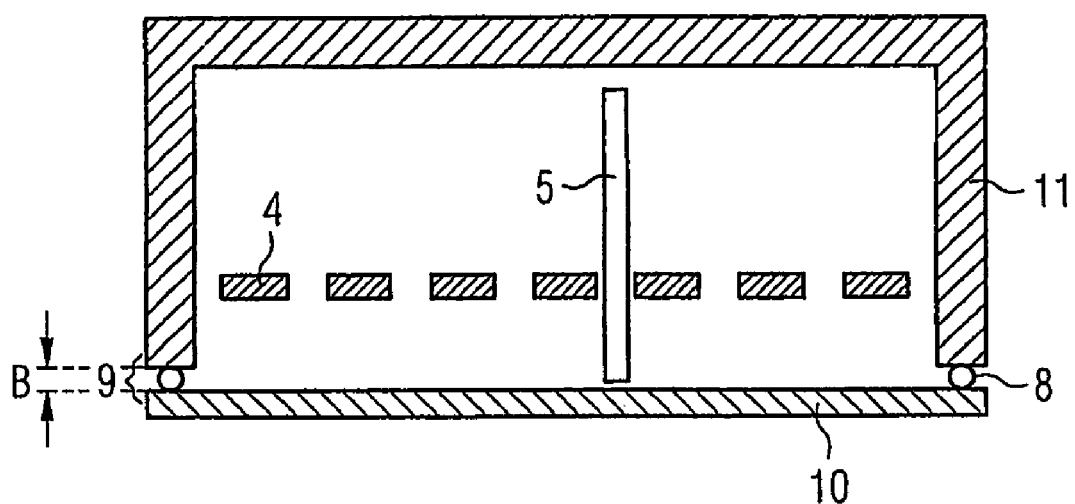
FIG. 3 shows an example of an additional retaining device in a schematic cross section.

FIG. 3 shows an additional embodiment of the retaining device. Equivalent reference symbols designate corresponding elements from FIG. 2. The retaining device includes a baseplate 10, which is covered by a cap 11. Inside cap 11, a latticed insert 4 is provided to accommodate unsintered components 5.

Figure 4:
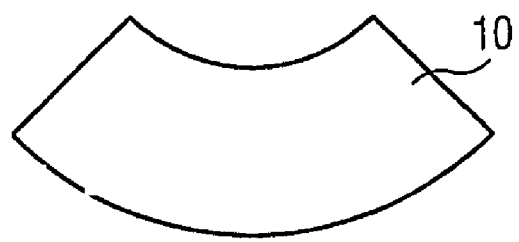
FIG. 4 shows a baseplate of the retaining device from FIG. 3 in a schematic top view.

The retaining device according to FIG. 3 has the advantage that when the latticed insert 4 is attached to the baseplate 10, the retaining device can be operated even without the cap 11, and thus is also suitable for use during binder removal. Baseplate 10 can advantageously be formed in the shape of a sector of a circular ring, as may be seen in FIG. 4. It is then advantageous to also design the latticed insert 4 and the cap 11 in the shape of a sector of a circular ring. A plurality of baseplates 10 and the corresponding latticed inserts 4 and caps 11 can be lined up and completed into a circular ring.

The present invention is not confined to the production of piezo actuators, but rather is applicable to all ceramic multi-layer components, in particular those that include metallic internal electrodes or internal electrodes of non-noble metals.

For example, multi-layer capacitors are also possible that have internal electrodes of copper, and contain $BaNd_2Ti_4O_{12}$ and $Nd_2Ti_2O_7$ as ceramic and $ZnO-B_2O_3-SiO_2$ as a glass frit.

What is claimed is:

1. A retaining device for use when sintering electrical components comprised of ceramic and electrodes inside the ceramic, the electrodes containing metal, the retaining device comprising:
    a structure to hold the electrical components, the structure having a surface that contains a sintering aid, the sintering aid comprising a material that is able to bind to a gas contained in the structure and to release the gas.

2. The retaining device of claim 1, wherein the structure comprises:
    a latticed insert to hold the electrical components;
    a container that holds the latticed insert;
    a cover for the container; and
    an element to provide a gap between the container and the cover.

3. The retaining device of claim 1, wherein the structure comprises:
    a baseplate;
    a latticed insert over the baseplate, the latticed insert for holding the electrical components;
    a cap that substantially covers the latticed insert; and
    an element to provide a gap between the baseplate and the cap.

4. The retaining device of claim 3, wherein the baseplate has a semi-circular shape.

5. The retaining device of claim 1, wherein the gap is between 0.5 mm and 10 mm.

6. A retaining device for use when sintering electrical components comprised of ceramic and electrodes inside the ceramic, the electrodes containing a first metal, the retaining device comprising:
    a structure to hold the electrical components, the structure having a surface that contains second metal, the second metal having a redox potential that is at least as great as a redox potential of the first metal.

7. The retaining device of claim 6, wherein the structure comprises
    a latticed insert to hold the electrical components;
    a container that holds the latticed insert;
    a cover for the container; and
    an element to provide a gap between the container and the cover.

8. The retaining device of claim 6, wherein the structure comprises
    a baseplate;
    a latticed insert over the baseplate, the latticed insert for holding the electrical components;
    a cap that substantially covers the latticed insert; and
    an element to provide a gap between the baseplate and the cap.

9. The retaining device of claim 8, wherein the baseplate has a semi-circular shape.

10. The retaining device of claim 6, wherein the gap is between 0.5 mm and 10 mm.

* * * * *

UNITED STATES PATENT AND TRADEMARK OFFICE
CERTIFICATE OF CORRECTION

PATENT NO. : 7,781,945 B2 Page 1 of 1
APPLICATION NO. : 12/371132
DATED : August 24, 2010
INVENTOR(S) : Peter Sedlmaier It is certified that error appears in the above-identified patent and that said Letters Patent is hereby corrected as shown below:

On the Title page
Item (30) Below "Related U.S. Application Data"

Insert -- Foreign Application Priority Data
    Feb. 13, 2003 (DE) PCT/DE03/00435
    Feb. 13, 2003 (DE) 10205877.6 --

Signed and Sealed this

Thirtieth Day of November, 2010

David J. Kappos
*Director of the United States Patent and Trademark Office*

UNITED STATES PATENT AND TRADEMARK OFFICE
CERTIFICATE OF CORRECTION

PATENT NO.       : 7,781,945 B2                              Page 1 of 1
APPLICATION NO.  : 12/371132
DATED            : August 24, 2010
INVENTOR(S)      : Peter Sedlmaier It is certified that error appears in the above-identified patent and that said Letters Patent is hereby corrected as shown below:

Title page; Item (30) Under "Foreign Application Priority Data"

Insert -- Feb. 13, 2002 -- before (DE) 10205877.6

Signed and Sealed this
Second Day of September, 2014

Michelle K. Lee
*Deputy Director of the United States Patent and Trademark Office*